United States Patent
Zhang et al.

(10) Patent No.: US 9,767,891 B2
(45) Date of Patent: Sep. 19, 2017

(54) PASSIVE SRAM WRITE ASSIST

(71) Applicant: Avago Technologies General IP (Singapore) Pte. Ltd., Singapore (SG)

(72) Inventors: Yifei Zhang, Edina, MN (US); Myron Buer, Savage, MN (US); Mark Winter, Seattle, WA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/137,291

(22) Filed: Dec. 20, 2013

(65) Prior Publication Data

US 2015/0146476 A1    May 28, 2015

Related U.S. Application Data (60) Provisional application No. 61/909,844, filed on Nov. 27, 2013.

(51) Int. Cl.
  *G11C 11/419*    (2006.01)
(52) U.S. Cl.
  CPC ................ *G11C 11/419* (2013.01)
(58) Field of Classification Search
  USPC .............. 365/154, 189.11, 189.14, 189.16
  See application file for complete search history.

(56) References Cited

U.S. PATENT DOCUMENTS

| | | | |
|---|---|---|---|
| 2007/0236983 A1* | 10/2007 | Wang et al. | 365/154 |
| 2012/0014172 A1* | 1/2012 | Jung et al. | 365/154 |
| 2013/0294153 A1* | 11/2013 | Dodge | 365/163 |
| 2014/0003132 A1* | 1/2014 | Kulkarni | G11C 7/227 365/154 |
| 2014/0092685 A1* | 4/2014 | Yoon et al. | 365/185.17 |
| 2014/0092695 A1* | 4/2014 | Hua et al. | 365/189.11 |

* cited by examiner

*Primary Examiner* — Vu Le
*Assistant Examiner* — Sung Cho
(74) *Attorney, Agent, or Firm* — Sterne, Kessler, Goldstein & Fox P.L.L.C.

(57) ABSTRACT

Passive write assist passively improves SRAM performance (e.g., write margin speed) while reducing manufacturing costs (e.g., die area, packaging) and operating costs (e.g., power consumption, cooling) associated with active write assist schemes. Passive write assist may be implemented in peripheral circuitry or embedded in an SRAM array or even in each array cell or bitcell. For example, one or more memory cells may be converted to provide passive write assist to a plurality of other memory cells. As another example, each memory cell may independently implement passive write assist using one or more high resistive contacts to couple to the array power supply, resulting in the array voltage level being changed by different amounts in different memory cells according to cell variations.

20 Claims, 3 Drawing Sheets

PASSIVE SRAM WRITE ASSIST

CROSS-REFERENCE TO RELATED APPLICATION(S)

This application claims the benefit of U.S. Provisional Patent Application No. 61/909,844, entitled "Passive SRAM Write Assist," filed Nov. 27, 2013, the entirety of which is incorporated by reference herein.

BACKGROUND

Problems with state of the art static random access memory (SRAM) write assist techniques include consumption of too much area and power, which increase die, packaging, cooling and operating costs, and limited performance improvement due to functional limitations, such as setup time requirements and interfaces between SRAM and peripheral control circuitry that limit SRAM performance (e.g., operating speed). Accordingly, there is a need to overcome one or more drawbacks and deficiencies in the state of the art.

BRIEF SUMMARY

Methods, systems, and apparatuses are described for passive SRAM write assist techniques, substantially as shown in and/or described in connection with at least one of the figures, as set forth more completely in the claims.

BRIEF DESCRIPTION OF THE DRAWINGS/FIGURES

The foregoing summary, as well as the following detailed description, is better understood when read in conjunction with the accompanying drawings. The accompanying drawings, which are incorporated herein and form part of the specification, illustrate a plurality of embodiments and, together with the description, further serve to explain the principles involved and to enable a person skilled in the relevant art(s) to make and use the disclosed technologies. However, embodiments are not limited to the specific implementations disclosed herein. Unless expressly indicated by common numbering, each figure represents a partially or entirely different embodiment where components and steps in each embodiment are intentionally numbered differently compared to potentially similar components in other embodiments. The left-most digit(s) of a reference number identifies the number of the figure in which the reference number first appears.

Exemplary embodiments will now be described with reference to the accompanying figures.

DETAILED DESCRIPTION

I. Introduction

Reference will now be made to embodiments that incorporate features of the described and claimed subject matter, examples of which are illustrated in the accompanying drawings. While the technology will be described in conjunction with various embodiments, it will be understood that the embodiments are not intended to limit the present technology. The scope of the subject matter is not limited to the disclosed embodiment(s). On the contrary, the present technology is intended to cover alternatives, modifications, and equivalents, which may be included within the spirit and scope the various embodiments as defined herein, including by the appended claims. In addition, in the following detailed description, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the embodiments presented.

References in the specification to "embodiment," "example" or the like indicate that the subject matter described may include a particular feature, structure, characteristic, or step. However, other embodiments do not necessarily include the particular feature, structure, characteristic or step. Moreover, "embodiment," "example" or the like do not necessarily refer to the same embodiment. Further, when a particular feature, structure, characteristic or step is described in connection with an embodiment, it is submitted that it is within the knowledge of one skilled in the art to effect such feature, structure, or characteristic in connection with other embodiments whether or not those other embodiments are explicitly described.

Certain terms are used throughout the following description and claims to refer to particular system components and configurations. As one skilled in the art will appreciate, various skilled artisans and companies may refer to a component by different names. The discussion of embodiments is not intended to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection or through an indirect electrical connection via other devices and connections.

II. Exemplary Passive SRAM Write Assist

Memory, including SRAM, is an integrated circuit implemented alone or with other components and systems having multiple functions. For example, SRAM is often implemented as cache in processors and systems on a chip because SRAM access is relatively fast and it statically maintains data without refreshing. SRAM consists of an array of memory cells. Each memory cell (e.g., bitcell) may comprise, for example, a latch formed by cross-coupled inverters. Rows of bit cells are accessed by wordline signals while specific bits within rows are accessed by column or bitline signals. In practice, a wordline may be asserted to enable a pair of pass gates to permit access to a bitcell while a pair of bitlines may assert a logical high (e.g., described herein as a 1) or a logical low (e.g., described herein as a 0) on a pair of pass gates to read or write data (e.g., a 0 or 1 bit) to the bitcell.

Read and write margins are representations of reliable conditions in which a bitcell can be successfully read (i.e., without changing its state) and a state can be successfully written to the bitcell. The margins are affected by global variations (i.e., manufacturing process and operating variations, such as temperature and voltage) common to many bitcells and local variations common to only one bitcell. Normal operating conditions may include, for example, a particular temperature range and a power supply voltage range, e.g., VDD+/-10%. Additionally, due to global and local process variations, tolerances for read and write operations may be different from bitcell to bitcell. As transistors and bitcells shrink (e.g., comparing older 90 nm planar field effect transistor (FET) process technology to newer 16 nm finFET process technology), global and local variations in manufacturing and operating parameters are increasingly problematic to read and write margins.

In order to improve SRAM performance for read and write operations, various techniques have been implemented to increase the reliability of read and write operations for all bitcells during predictable operating conditions. One write assist technique is active VDD lowering, which devotes substantial area and power consumption for globally defined control logic and control circuitry to temporarily reduce a voltage supplied to pull-up transistors in a bitcell. This makes the pull-up transistors weaker or more susceptible to change so that the voltage level asserted on passgate transistors can more reliably be written to the bitcell for various operating conditions. Even though only a few bitcells may be weak, the global solution is to drive every bitcell as if it were weak to ensure every bitcell is reliable, which consumes more power. Another write assist technique is negative bitline boost, which devotes substantial area and power consumption for control logic and control circuitry to temporarily reduce a voltage asserted on a bitline to less than zero volts. This temporarily boosts the passgate transistors relative to the pull-up transistors, thereby improving the margin. Again, even though only a few bitcells may be weak, the global solution is to drive every bitcell as if it were weak to ensure every bitcell is reliable, which consumes more power.

Problems with state of the art SRAM write assist techniques include consumption of too much area and power, which increase die, packaging, cooling and operating costs, and limited performance improvement due to functional limitations, such as setup time requirements and interfaces between SRAM and peripheral control circuitry that limit SRAM performance (e.g., operating speed).

Methods, systems, and apparatuses will now be described for passive SRAM write assist techniques that overcome one or more drawbacks and deficiencies in the state of the art. Passive write assist passively improves SRAM performance (e.g., write margin, speed) while reducing manufacturing costs (e.g., die area, packaging) and operating costs (e.g., power consumption, cooling) associated with active write assist schemes. Passive write assist may be implemented in peripheral circuitry or embedded in an SRAM array or even in each array cell. For example, one or more memory cells may be converted to provide passive write assist to a plurality of other memory cells. As another example, each memory cell may independently implement passive write assist using one or more high resistive contacts to couple to the array power supply, resulting in the array voltage level being changed by different amounts in different memory cells according to cell variations.

Figure 1:
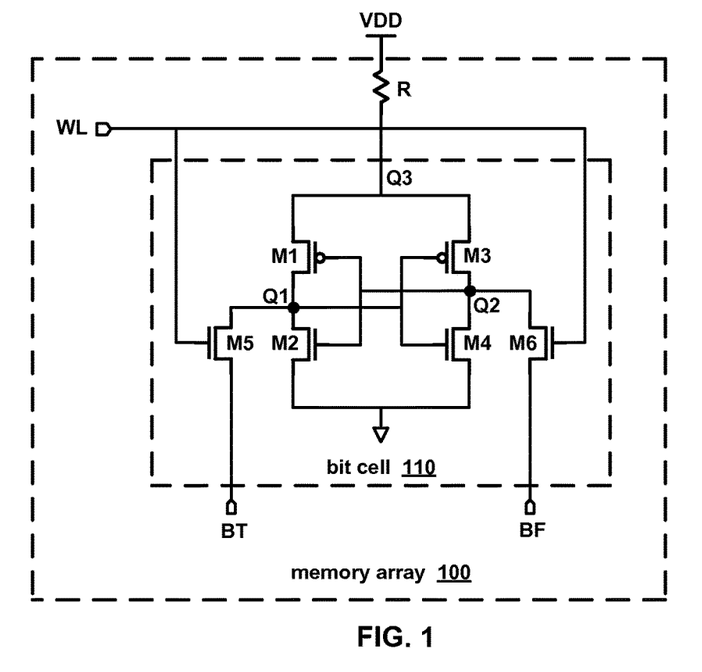
FIG. 1 shows an exemplary embodiment of a memory cell array comprising passive write assist.

FIG. 1 shows an exemplary embodiment of a memory cell array comprising passive write assist. While passive write assist techniques are shown as being implemented alone, it is notable that passive write assist techniques may be implemented as alternatives to other techniques or may be implemented together with other techniques to improve read and/or write margins.

Memory array 100 comprises an array of bit cells, including bit cell 110. Memory array 100 may comprise any type of memory that may utilize write assist, including but not limited to SRAM. Bit cell 110 may be any type and configuration of a memory cell. For example, bit cell 110 may comprise a four transistor (4T), six transistor (6T), eight transistor (8T), ten transistor (10T) or any other type of memory cell. Bit cell 110 may be implemented in any technology, whether planar (two-dimensional or 2D) or 3D (e.g., finFET or tri gate).

In the example shown in FIG. 1, bit cell 110 is a 6T memory cell, the six transistors comprising pull-up transistors M1, M3, pull-down transistors M2, M4 and pass-gate transistors M5, M6. Generally, first pull up transistor M1 and first pull down transistor M2 form a first inverter between true input node Q1 and false input node Q2. Second pull up transistor M3 and second pull down transistor M4 form a second inverter between false input node Q2 and true input node Q1. Thus, the first and second inverters are cross coupled, forming a latch. First passgate M5 is enabled and disabled by wordline WL to permit true bitline BT to read from and write to the first inverter at true input node Q1. Second passgate M6 is enabled and disabled by wordline WL to permit false bitline BF to read from and write to the second inverter at false input node Q2.

Specifically, bit cell 110 is a complementary metal oxide semiconductor (CMOS) cell. First and second pull up transistors M1, M3 are P-channel metal oxide field effect transistors (MOSFETs), i.e., PMOS transistors or PFETs, while first and second pull down transistors M2, M4 and first and second pass-gate transistors M5, M6 are N-channel MOSFETs, i.e., NMOS transistors or NFETs. In other embodiments, memory cell 110 may be implemented with the same or different configuration using the same or different transistor technology.

First pull-up transistor M1 has its source node coupled to power supply node Q3, its drain node coupled to true input node Q1 and its gate node coupled to false input node Q2. First pull-down transistor M2 has its drain node coupled to true input node Q1, its source node coupled to ground and its gate node coupled to false input node Q2. First passgate M5 has its drain node coupled to true input node Q1, its source node coupled to true bitline BT and its gate node coupled to wordline WL. Second pull-up transistor M3 has its source node coupled to power supply node Q3, its drain node coupled to false input node Q2 and its gate node coupled to true input node Q1. Second pull-down transistor M4 has its drain node coupled to false input node Q2, its source node coupled to ground and its gate node coupled to true input node Q1. Second passgate M6 has its drain node coupled to false input node Q2, its source node coupled to false bitline BF and its gate node coupled to wordline WL.

Bit cell 110 has several states, including hold or idle, read and write states. A hold state occurs when wordline WL is logical low or 0, e.g., coupled to ground. A write state occurs when wordline WL is logical high or 1, e.g., coupled to VDD, with true bitline BT and false bitline BF asserted as 1, 0 or 0, 1, respectively, depending on whether a 1 or 0 is being written to bitcell 110. For example, to write a 1 to bitcell 110, true bitline BT is 0 and false bitline is 1. To write a 0 to bitcell 110, true bitline BT is 1 and false bitline BF is 0. A read state occurs when wordline WL is logical high and true and false bitlines BT, BF are not asserted.

The ability to read and write, quantified as read and write margins, may depend on the relative strength of transistors in bit cell 110, which may in turn be based on transistor dimensions, doping and applied voltage. These and other factors must be balanced to obtain reliable read and write operations. Variations at the cell or local level and variations at the array or global level provide additional layers of difficulty in managing read and write margins. This has led to complex solutions that introduce negative impacts on performance and cost. These complex active solutions tend to force a global solution on every cell, which may consume area, time and power for cells that do not require it. A passive solution consumes fewer resources to maintain read and write margins.

Figure 2:
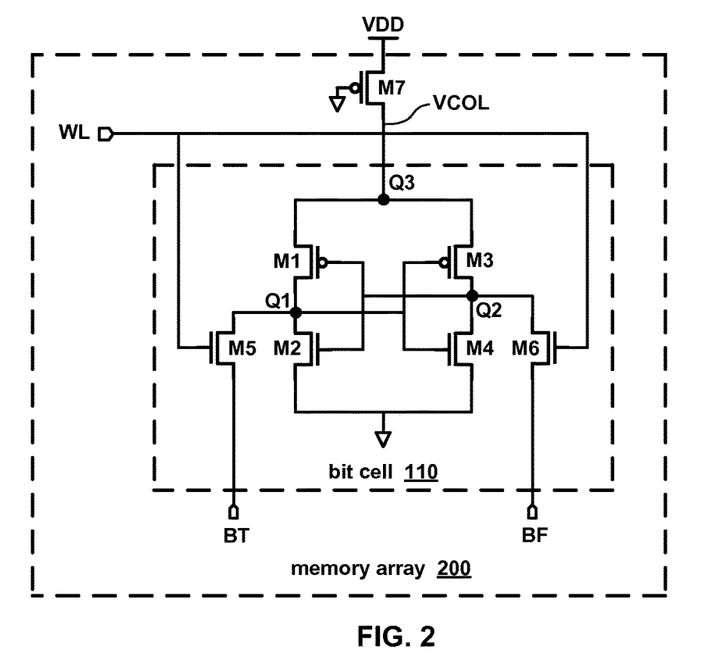
FIG. 2 shows an exemplary embodiment of a memory cell array comprising passive write assist integrated in the array.
Figure 3:
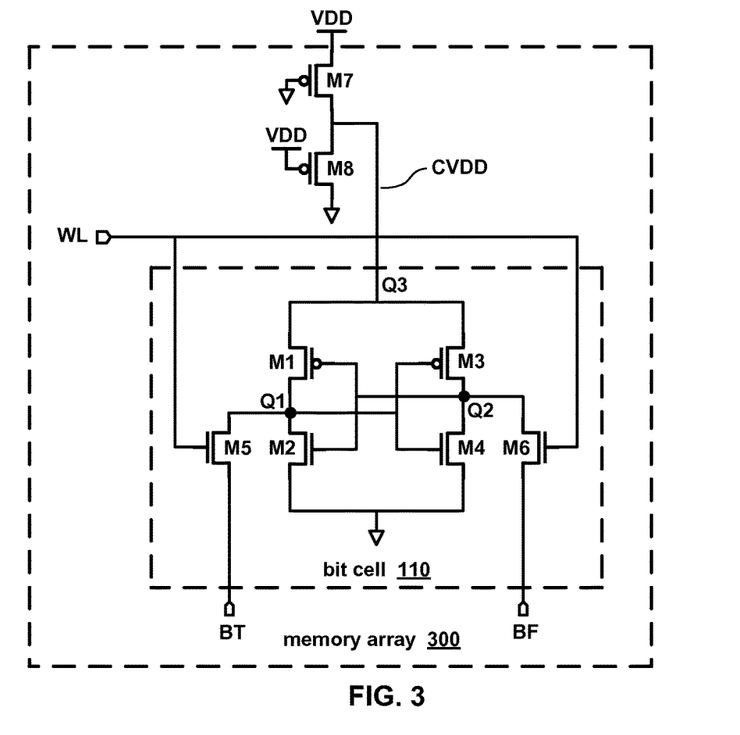
FIG. 3 shows an exemplary embodiment of a memory cell array comprising passive write assist integrated in the array.
Figure 4:
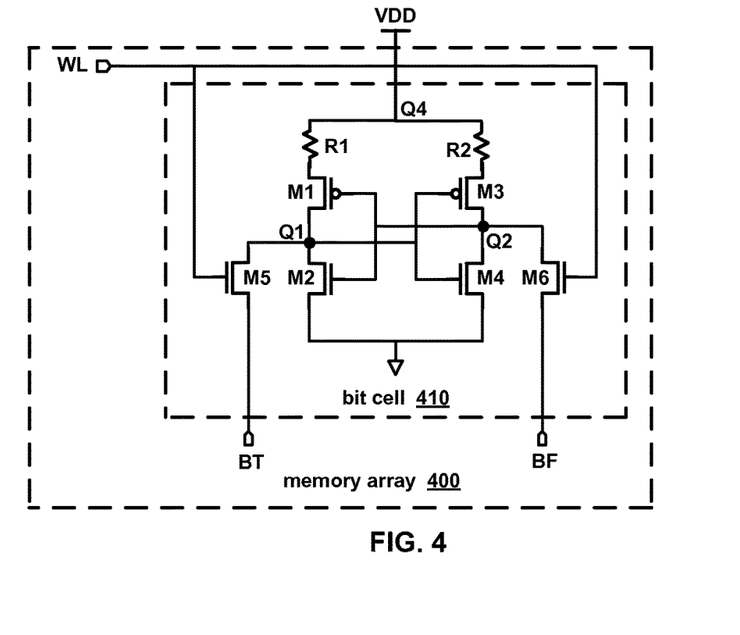
FIG. 4 shows an exemplary embodiment of a memory cell array comprising passive write assist integrated in each cell.

As shown in FIG. 1, a passive solution comprises resistance R coupled between a power supply having voltage (supply voltage) VDD, which supplies power to memory array 100, and power supply node Q3. The function of resistance R is to passively reduce or lower supply voltage VDD for bitcell 110 to make bitcell 110 more susceptible to having its state changed during a write operation. Passive resistor R may be a resistor or resistance may be introduced by configuration of another component, such as a transistor. The resistance may be in a peripheral circuit, integrated in memory array 100 or integrated in bitcell 110. Performance may be improved with integration. In FIGS. 2-4, several of many possible passive write assist techniques are presented.

FIG. 2 shows an exemplary embodiment of a memory cell array comprising passive write assist integrated in the array. As shown in FIG. 2, passive write assist is implemented for memory array 200 by converting a PMOS transistor to provide resistance R. PMOS transistor M7 has its source node coupled to supply voltage VDD, its drain node coupled to power supply node Q3 and its gate node coupled to ground. No active control circuitry or signaling is required. PMOS transistor M7 is permanently enabled. Current flows from voltage source VDD to bitcell 110 through PMOS transistor M7. The resistance across PMOS transistor M7 reduces supply voltage VDD. Thus, PMOS transistor M7 passively reduces supply voltage VDD to a lower voltage at power supply node Q3, the reduced voltage identified as column voltage VCOL. The reference to a column voltage alludes to providing a reduced voltage level to a plurality of bitcells in a column of bitcells, each bitcell in the column being in a different row of memory array 200.

Placing the source nodes of first and second pull-up transistors M1, M3 at a lower voltage level effectively weakens first and second pull-up transistors M1, M3, placing first and second pass gates M5, M6 in a stronger position relative to first and second pull-up transistors M1, M3 to successfully change the state of bitcell 110 during a write operation. In other words, the write margin is improved by lowering column voltage VCOL. Depending on the particulars of an implementation, e.g., transistor technology, relative transistor dimensions, doping and applied voltage level, in some embodiments increasing the write margin may reduce the read margin. For each implementation of passive write assist, an appropriate balance must be struck to obtain satisfactory read and write margins based on ordinary design principles within the knowledge of one of ordinary skill. An appropriate adjustment may take into account (i.e., be based in part on) other factors or conditions in a write operation. For example, at least in some embodiments, crosstalk between true and false bitlines BT, BF and column voltage VCOL couple column voltage down during a write operation, further increasing the write margin.

Passive write assist provided by PMOS transistor M7 in this embodiment may be implemented in peripheral circuitry, integrated in memory array 200 or integrated in bitcell 110. As one of many examples that integrate passive write assist into memory array 200, PMOS transistor M7 may comprise one or more transistors in memory array 200 that are converted or repurposed to provide passive write assist rather than another original or design purpose, such as functioning as a memory cell. A repurposed bitcell may comprise, for example, modifying gate, source and drain electrical connections of one or more transistors in a bitcell 6T SRAM transistors prior to fabrication. As one example, in an array of bitcells in memory array 200, one or more bitcells (e.g., an entire row of bitcells) may be converted to provide a resistive passive write assist to reduce the voltage supplied to one or more sets (e.g., columns) of bitcells. A repurposed PMOS transistor is referred to as a PMOS header (PHDR) device. Depending on desired performance, a PHDR device may provide passive write assist to 16, 32, 64, 128, 256 or more or fewer bitcells. A larger number of bitcells may lead to slower performance due to effective capacitance on true and false bitlines BT, BF and at power supply node Q3, all in common with a column of bitcells provided with passive write assist. Effective capacitance may comprise parasitic capacitance from metal/contact conduction layers in the bitcell array and diffusion capacitance from the diode at the source/drain side of transistors.

In contrast to active write assist, passive write assist improves performance (e.g., increases speed) and decreases area, power consumption and complexity. For example, compared to active write assist for 64 rows of bitcells, passive write assist for 64 rows of bitcells, at least in some implementation, uses only one row while active write assist requires the equivalent of four to eight rows and requires peripheral control circuitry, setup time, large capacitive charge and discharge and consumes at least two times more power.

Passive write assist provides a substantial reduction in power consumption compared to active write assist techniques. Resistive passive write assist lowers column voltage VCOL until a bitcell state is set during a write operation. Due to local variation, each bitcell may have a different column voltage VCOL during write operations. The weaker the bitcell is, the lower column voltage VCOL needs to be. This local variation is desirable because it avoids wasting power in a one size fits all approach based on a weakest cell. For passive write assist techniques, power consumption is proportional to the number of bits multiplied by the average reduction in supply voltage VDD. In contrast, for active VDD lowering write assist techniques, power consumption is proportional not to an average reduction in VDD, but to the maximum reduction in VDD, multiplied by the number of bits. With regard to scaling, the average VDD reduction does not change with the number of bits. In contrast, with respect to active VDD lowering, the maximum increases with the number of bits. As the number of bits in a die increases, there will be a greater reduction in power consumption by passive write assist techniques compared to active write assist techniques.

FIG. 3 shows another exemplary embodiment of a memory cell array comprising passive write assist integrated in the array. As shown in FIG. 3, passive write assist is implemented for memory array 300 by converting two PMOS transistors to provide resistance R. For example, first and second pull-up transistors M1, M3 in a bitcell may be converted to provide resistance R. In such embodiments, PMOS transistor M7 is referred to as PHDR and PMOS transistor M8 is referred to as PMOS lower or PLWR device. In some embodiments, every transistor in a repurposes bitcell may be have one or more of its gate, drain and source nodes rewired.

PMOS transistor M7 has its source node coupled to supply voltage VDD, its drain node coupled to power supply node Q3 and its gate node coupled or tied off to ground. PMOS transistor M8 has its source node coupled to power supply node Q3, its drain node coupled to ground and its gate node coupled or tied off to supply voltage VDD. PMOS transistor M7 is permanently enabled while PMOS transistor M8 is permanently disabled. Current flows from voltage source VDD to bitcell 110 through PMOS transistor M7. The resistance across PMOS transistor M7 reduces supply voltage VDD for bitcell 110. No active control circuitry or signaling is required. Thus, PMOS transistors M7 and M8 passively reduce supply voltage VDD to a lower voltage at the power supply node Q3, the reduced voltage identified as column voltage VCOL. The reference to a column voltage alludes to providing a reduced voltage level to a plurality of bitcells in a column of bitcells, each bitcell in the column being in a different row of memory array 300.

Placing the source nodes of first and second pull-up transistors M1, M3 at a lower voltage level effectively weakens first and second pull-up transistors M1, M3, placing first and second pass gates M5, M6 in a stronger position relative to first and second pull-up transistors M1, M3 to successfully change the state of bitcell 110 during a write operation. In other words, the write margin is improved by lowering column voltage VCOL. Depending on the particulars of an implementation, e.g., transistor technology, relative transistor dimensions, doping and applied voltage level, in some embodiments increasing the write margin may reduce the read margin. For each implementation of passive write assist, an appropriate balance must be struck to obtain satisfactory read and write margins based on ordinary design principles within the knowledge of one of ordinary skill. An appropriate adjustment may take into account (i.e., be based on) other factors or conditions in a write operation. For example, at least in some embodiments, crosstalk between true and false bitlines BT, BF and column voltage VCOL couple column voltage down during a write operation, further increasing the write margin.

Passive write assist provided by PMOS transistors M7 and M8 in this embodiment may be implemented in peripheral circuitry, integrated in memory array 300 or integrated in bitcell 110. As one of many examples that integrate passive write assist into memory array 300, PMOS transistors M7 and M8 may comprise at least two transistors in memory array 300 that are converted or repurposed to provide passive write assist rather than another original or design purpose, such as functioning as one or more memory cells. In an array of bitcells in memory array 300, one or more bitcells (e.g., an entire row of bitcells) may be converted to PHDR device (i.e., PMOS transistor M7) and PLWR device (i.e., PMOS transistor M8) to provide a resistive passive write assist to reduce the voltage supplied to one or more sets of bitcells (e.g., columns of bitcells). For example, depending on desired performance, a PHDR and PLWR device may provide passive write assist to 16, 32, 64, 128, 256 or more or fewer bitcells while improving performance (e.g., increasing speed) and decreasing area, power consumption and complexity compared to active write assist schemes.

FIG. 4 shows an exemplary embodiment of a memory cell array comprising passive write assist integrated in each cell. As shown in FIG. 4, passive write assist is implemented for memory array 400 by first and second high resistive contacts R1, R2 to provide resistance R. In various embodiments utilizing high resistive contacts, one or more high resistive contacts may be implemented in memory array 100 or in each bitcell between source voltage VDD and power supply node Q3 or between power supply node Q3 and the source nodes of first and second pull up transistors M1, M2. As shown in the embodiment in FIG. 4, first high resistive contact R1 is implemented between power supply node Q3 and the source node of first pull-up transistor M1. Second high resistive contact R2 is implemented between power supply node Q3 and the source node of second pull-up transistor M3.

Current flows from voltage source VDD to bitcell 410 through first and second high resistive contacts R1, R2. The resistance across first and second high resistive contacts R1, R2 reduces supply voltage VDD to a lower voltage at the source nodes of first and second pull-up transistors M1, M3. Unlike other possible embodiments implementing high resistive contacts in memory array 400 and unlike embodiments presented in FIGS. 1-3 where passive write assist serves a plurality of bitcells, e.g., with the same column voltage VCOL, passive write assist integrated into bit cell 410 is a local passive write assist only for bitcell 410. Accordingly, since each cell may vary somewhat from other cells, passive write assist integrated into each bitcell may provide non-uniform write assist, as opposed to uniform write assist to a multiple bitcells discussed in other embodiments.

Placing the source nodes of first and second pull-up transistors M1, M3 at a lower voltage level effectively weakens first and second pull-up transistors M1, M3, placing first and second pass gates M5, M6 in a stronger position relative to first and second pull-up transistors M1, M3 to successfully change the state of bitcell 410 during a write operation. In other words, the write margin is improved by lowering the voltage applied to the source nodes of first and second pull-up transistors M1, M3. Depending on the particulars of an implementation, e.g., transistor technology, relative transistor dimensions, doping and applied voltage level, in some embodiments increasing the write margin may reduce the read margin. For each implementation of passive write assist, an appropriate balance must be struck to obtain satisfactory read and write margins based on ordinary design principles within the knowledge of one of ordinary skill.

In contrast to active write assist, passive write assist improves performance (e.g., increases speed) and decreases area, power consumption and complexity. For example, compared to active write assist for 64 rows of bitcells, passive write assist using high resistive contacts, whether implemented in memory array 400 for multiple bitcells or implemented in each bitcell, does not require any additional area while active write assist requires the equivalent of four to eight rows and requires peripheral control circuitry, setup time, large capacitive charge and discharge and consumes multiple times more power.

Figure 5:
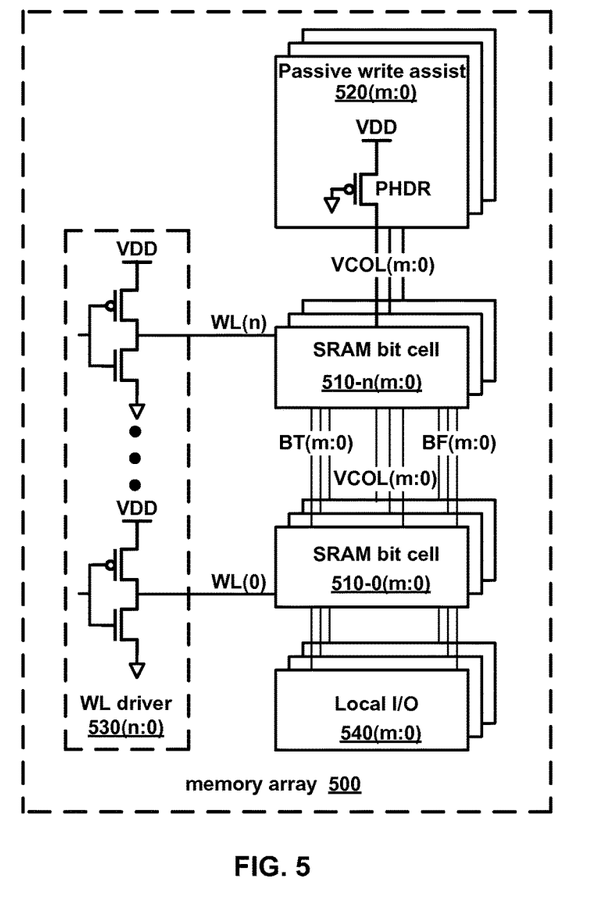
FIG. 5 shows an exemplary embodiment of a memory cell array comprising passive write assist.

FIG. 5 shows a block diagram of an exemplary embodiment of a memory cell array comprising passive write assist. In the embodiment shown in FIG. 5, Memory array 500 may comprise memory array 100, 200, 300, 400 or any other memory array. Memory array 500 comprises an array of bitcells 510, a row of passive write assist circuitry 520, a column of wordline drivers 530 and a row of local I/O 540. The block diagram in FIG. 5 is not intended to be exhaustive. An embodiment may have more or fewer blocks. FIG. 5 merely draws attention to selected blocks.

Array of bitcells 510 comprises rows 0 through n and columns 0 through m, each row of bitcells being identified as 510-0($m$:0) through 510-$n$(m:0). The number of rows is unlimited. In various embodiments, the number of rows may comprise 16, 32, 64, 128, 256 or more or fewer rows. Each bitcell in array of bitcells 510 may comprise bitcell 110, 410 or another bitcell. As shown in previous examples, a wordline enables pass gates in bitcells within a row. Accordingly, wordline driver 530 comprises n+1 drivers, i.e., a driver for each row 0 through n, generating wordline 0 through wordline n WL(0)-WL(n). Row of bitcells 510-0($m$:0) receives wordline WL(0), row of bitcells 510-$n$(m:0) receives wordline WL(n) and so on. Also as shown in previous examples, true and false bitlines read and write bitcells in particular columns that have been enabled by a wordline. Accordingly, bitline drivers (not shown) generate a true and false bitline for each column of bitcells. The column of bitcells in column m, i.e., bitcells 510-0($m$)-510-$n$(m), receive true and false bitlines BT(m), BF(m), the column of bitcells in column 0, i.e., 510-0(0) through 510-$n$(0), receive true and false bitlines BT(0), BF(0) and so on.

Local I/O 540 comprises columns 0 through m. Local I/O 540($m$) is coupled to true and false bitlines BT(m), BF(m), local I/O 540(0) is coupled to true and false bitlines BT(0), BF(0). Bits (data) read from or to be written to bitcells via true and false bitlines BT and BF are provided to local I/O by bitlines BT, BF (in the case of a read) or by local I/O 540 to true and false bitlines BT, BF (in the case of a write).

Passive write assist 520 is provided for each column of bitcells 0 through m in memory array 500. Passive write assist 520 may comprise passive write assist shown in FIGS. 1-4 or any other passive write assist to bitcells 510 in memory array 500. As shown in the embodiment of FIG. 5, passive write assist in each column o through m comprises a PMOS header PHDR, which was discussed with respect to FIG. 2. Thus, in this embodiment, a row of bitcells is converted to provide passive write assist to bitcells in rows o through n of memory array 500. While passive write assist provided by the PMOS transistor, i.e., header PHDR, is integrated in memory array 500 in this embodiment, in other embodiments the write assist may be implemented in peripheral circuitry or integrated in each bitcell in the array of bitcells 510.

Each PMOS header PHDR for each column 0 through m has its source node coupled to supply voltage VDD, its drain node coupled to a power supply node of each bitcell in a respective column 0 through m and its gate node coupled to ground. Each PMOS header PHDR(m:0) is permanently enabled. Current flows from voltage source VDD to each column of bitcells 510($m$:0) through PMOS header PHDR (m:0). The resistance across PMOS header PHDR(m:0) passively reduces supply voltage VDD supplied to each column of bitcells, each bitcell in the column being in a different row of memory array 500. The reduced voltage provided to each bitcell is identified as column voltage VCOL(m:0). The write margin is improved by lowering supply voltage VDD to column voltage VCOL. In contrast to active write assist, passive write assist improves performance (e.g., increases speed) and decreases area, power consumption and complexity.

III. Exemplary Method

Figure 6:
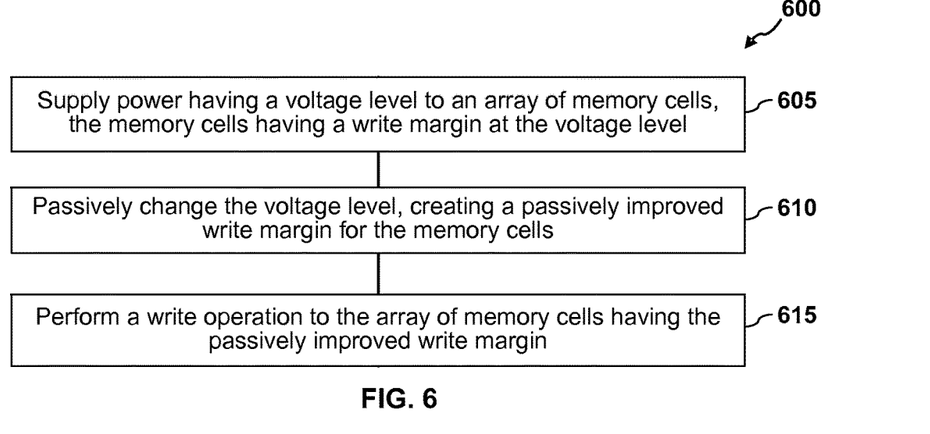
FIG. 6 shows an exemplary method of operating a memory cell array comprising passive write assist.

Embodiments may also be implemented in processes or methods. For example, FIG. 6 shows an exemplary method of operating a memory cell array comprising passive write assist. Memory array 100, 200, 300, 400 500 and other embodiments may operate according to method 600. Method 600 comprises steps 605 to 615. However, other embodiments may operate according to other methods. Other structural and operational embodiments will be apparent to persons skilled in the relevant art(s) based on the foregoing discussion of embodiments. No order of steps is required unless expressly indicated or inherently required. There is no requirement that a method embodiment implement all of the steps illustrated in FIG. 6. FIG. 6 is simply one of many possible embodiments. Embodiments may implement fewer, more or different steps.

Method 600 begins with step 605. In step 605, power having a voltage level is supplied to the array of memory cells, where the memory cells have a write margin at the voltage level. For example, as shown in FIGS. 1-5, power having a voltage level VDD is supplied to memory array 100, 200, 300, 400 and 500. Bitcells 110, 410, 510 each have a write margin at voltage level VDD.

At step 610, the voltage level is passively changed, creating a passively improved write margin for the memory cells. For example, as shown in each of FIGS. 1-5, a passive write assist technique is applied to change (e.g., reduce) the power supply voltage level VDD. In FIG. 1, resistance R passively changes (e.g., reduces) supply voltage VDD at power supply node Q3, which passively improves (e.g., increases) the write margin of bitcell 110. In FIG. 2, PMOS transistor M7 passively changes (e.g., reduces) supply voltage VDD at power supply node Q3 to column voltage VCOL, which passively improves (e.g., increases) the write margin of bitcell 110. In FIG. 3, PMOS transistors M7 and M8 passively change (e.g., reduce) supply voltage VDD at power supply node Q3 to column voltage VCOL, which passively improves (e.g., increases) the write margin of bitcell 110. In FIG. 4, resistive contacts R1, R2 passively change (e.g., reduce) supply voltage VDD at the source nodes of first and second pull-up transistors M1, M3, which passively improves (e.g., increases) the write margin of bitcell 410. In FIG. 5, PMOS headers PHDR(m:0) passively change (e.g., reduce) supply voltage VDD to column voltage VCOL(m:0), which passively improves (e.g., increases) the write margin of array of bitcells 510-0($m$:0) through 510-$n$ (m:0).

At step 615, a write operation is performed to the array of memory cells having the passively improved write margin. For example, as shown in each of FIGS. 1-5, when a write operation is performed, bitcells 110, 410, 510 have a passively improved write margin because bitcells 110, 410, 510 are supplied with a voltage level lower than supply voltage VDD.

Alternative embodiments could make use of many other memory arrays, memory cells, passive assist techniques and/or steps within the spirit and scope of the disclosed technology.

IV. Conclusion

Methods, systems, and apparatuses have been described for passive write assist, as shown in and/or described herein in connection with at least one of the figures, as set forth more completely in the claims. Passive write assist passively improves SRAM performance (e.g., write margin, speed)

while reducing manufacturing costs (e.g., die area, packaging) and operating costs (e.g., power consumption, cooling) associated with active write assist schemes. Passive write assist may be implemented in peripheral circuitry or embedded in an SRAM array or even in each array cell. For example, one or more memory cells may be converted to provide passive write assist to a plurality of other memory cells. As another example, each memory cell may independently implement passive write assist using one or more high resistive contacts to couple to the array power supply, resulting in the array voltage level being changed by different amounts in different memory cells according to cell variations.

Embodiments are not limited to the functional blocks, detailed examples, steps, order or the entirety of subject matter presented in the figures, which is why the figures are referred to as exemplary embodiments.

A device, as defined herein, is a machine or manufacture as defined by 35 U.S.C. §101. A device may comprise, for example but not limited to, a memory, processor, system on a chip (SoC) or any other device comprising memory. Devices may be implemented with any semiconductor technology, including one or more of a Bipolar Junction Transistor (BJT), a heterojunction bipolar transistor (HBT), a metal oxide field effect transistor (MOSFET) or complementary metal oxide semiconductor (CMOS) device, a metal semiconductor field effect transistor (MESFET) or other transconductor or transistor technology device. Such alternative devices may require alternative configurations other than the configuration illustrated in embodiments presented herein.

Techniques, including methods, described herein may be implemented in hardware (digital and/or analog) or a combination of hardware, software and/or firmware. Techniques described herein may be implemented in one or more components. Embodiments may comprise computer program products comprising logic (e.g., in the form of program code or software as well as firmware) stored on any computer useable medium, which may be integrated in or separate from other components. Such program code, when executed in one or more processors, causes a device to operate as described herein. Devices in which embodiments may be implemented may include storage, such as storage drives, memory devices, and further types of computer-readable media. Examples of such computer-readable media include, but are not limited to, a hard disk, a removable magnetic disk, a removable optical disk, flash memory cards, digital video disks, random access memories (RAMs), read only memories (ROM), and the like. In greater detail, examples of such computer-readable media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, as well as other media such as flash memory cards, digital video discs, RAM devices, ROM devices, and the like. Such computer-readable media may, for example, store computer program logic, e.g., program modules, comprising computer executable instructions that, when executed, provide and/or maintain one or more aspects of functionality described herein with reference to the figures, as well as any and all components, steps and functions therein and/or further embodiments described herein.

Note that such computer-readable storage media are distinguished from and non-overlapping with communication media (do not include communication media). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media. Embodiments are also directed to such communication media.

Proper interpretation of subject matter described herein and claimed hereunder is limited to patentable subject matter under 35 U.S.C. §101. Subject matter described in and claimed based on this patent application is not intended to and does not encompass unpatentable subject matter. As described herein and claimed hereunder, a method is a process defined by 35 U.S.C. §101. As described herein and claimed hereunder, each of a circuit, device, apparatus, machine, system, computer, module, media and the like is a machine and/or manufacture defined by 35 U.S.C. §101.

While a limited number of embodiments have been described, those skilled in the art will appreciate numerous modifications and variations there from. Embodiments have been presented by way of example only, and not limitation. It will be apparent to persons skilled in the relevant art(s) that various changes in form and details can be made therein without departing from the spirit and scope of the disclosed technologies. The exemplary appended claims encompass embodiments and features described herein, modifications and variations thereto as well as additional embodiments and features that fall within the true spirit and scope of the disclosed technologies. Thus, the breadth and scope of the disclosed technologies should not be limited by any of the above-described exemplary embodiments, but should be defined only in accordance with the following claims and their equivalents.

What is claimed is:

1. A method comprising:
providing passive write assist to a memory comprising an array of memory cells by:
supplying power having a voltage level to the array of memory cells, the memory cells having a write margin at the voltage level;
passively changing the voltage level with a circuit element that does not receive control signaling, creating a passively improved write margin for the array of memory cells, wherein the circuit element comprises a first transistor having a gate node coupled to ground, a source node coupled to a power supply having the voltage level and a drain node coupled to the array of memory cells and a second transistor having a gate node coupled to the power supply having the voltage level, a source node coupled to the drain node of the first transistor and a drain node coupled to ground; and
performing a write operation to the array of memory cells having the passively improved write margin.

2. The method of claim 1, wherein the passive write assist is embedded in the array of memory cells.

3. The method of claim 2, wherein the embedded passive write assist comprises a memory cell in the array of memory cells converted to provide passive write assist to a plurality of other memory cells in the array of memory cells.

4. The method of claim 3, wherein the plurality of other memory cells comprises one of 16, 32, 64, 128 and 256 memory cells.

5. The method of claim 1, wherein the first transistor is a PMOS transistor.

6. The method of claim 1, wherein the second transistor is a PMOS transistor.

7. The method of claim 2, wherein the passive write assist is embedded in each memory cell of the array of memory cells.

8. The method of claim 2, wherein the circuit element further comprises at least one high resistive contact coupling each memory cell of the array of memory cells to the power supply having the voltage level.

9. The method of claim 8, wherein the voltage level is changed by different amounts in different memory cells.

10. A device comprising:
   a memory comprising an array of memory cells having a write margin at a voltage level of power supplied to the array of memory cells; and
   a passive write assist that passively changes the voltage level with a circuit element that does not receive control signaling and improves the write margin during a write operation to the memory, wherein the circuit element comprises a first transistor having a gate node coupled to ground, a source node coupled to a power supply having the voltage level and a drain node coupled to the array of memory cells and a second transistor having a gate node coupled to the power supply having the voltage level, a source node coupled to the drain node of the first transistor and a drain node coupled to ground.

11. The device of claim 10, wherein the passive write assist is embedded in the array of memory cells.

12. The device of claim 11, wherein the embedded passive write assist comprises a memory cell in the array of memory cells converted to provide passive write assist to a plurality of other memory cells in the array of memory cells.

13. The device of claim 12, wherein the plurality of other memory cells comprises one of 16, 32, 64, 128 and 256 memory cells.

14. The device of claim 10, wherein the first transistor is a PMOS transistor.

15. The device of claim 10, wherein the second transistor is a PMOS transistor.

16. The device of claim 11, wherein the passive write assist is embedded in each memory cell of the array of memory cells.

17. The device of claim 16, wherein the circuit element further comprises at least one high resistive contact coupling each memory cell of the array of memory cells to the power supply having the voltage level.

18. A device comprising:
   a static random access memory (SRAM) comprising:
      an array of bit cells having a write margin at a voltage level of power supplied to the array of bit cells; and
      a passive write assist embedded in the array of bit cells, the embedded passive write assist passively changing the voltage level with a circuit element that does not receive control signaling and improving the write margin during a write operation to the SRAM, wherein the circuit element comprises a first transistor having a gate node coupled to ground, a source node coupled to a power supply having the voltage level and a drain node coupled to the array of bit cells and a second transistor having a gate node coupled to the power supply having the voltage level, a source node coupled to the drain node of the first transistor and a drain node coupled to ground.

19. The device of claim 18, wherein the embedded passive write assist is embedded in each bit cell of the array of bit cells.

20. The device of claim 18, wherein the embedded passive write assist comprises a bit cell in the array of bit cells converted to provide passive write assist to a plurality of other bit cells in the array of bit cells.

* * * * *